(12) United States Patent
Maloney

(10) Patent No.: US 7,126,356 B2
(45) Date of Patent: Oct. 24, 2006

(54) RADIATION DETECTOR FOR ELECTROSTATIC DISCHARGE

(75) Inventor: Timothy J. Maloney, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 98 days.

(21) Appl. No.: 10/836,458

(22) Filed: Apr. 30, 2004

(65) Prior Publication Data

US 2005/0258842 A1    Nov. 24, 2005

(51) Int. Cl.
*G01R 31/26* (2006.01)

(52) U.S. Cl. .................................. 324/750; 324/158.1

(58) Field of Classification Search .................. None
See application file for complete search history.

(56) References Cited

U.S. PATENT DOCUMENTS

| 2,909,190 | A | * | 10/1959 | Wilson | 137/487.5 |
| 5,315,255 | A | * | 5/1994 | Bettinger | 324/457 |
| 5,430,381 | A | * | 7/1995 | Dower | 324/452 |
| 5,463,379 | A | * | 10/1995 | Campbell et al. | 340/657 |

OTHER PUBLICATIONS

EMCO 7405 kit description from supplier website (ETS-EMCO).

* cited by examiner

*Primary Examiner*—Jermele Hollington
*Assistant Examiner*—Jimmy Nguyen
(74) *Attorney, Agent, or Firm*—Schwabe, Williamson & Wyatt, P.C.

(57) ABSTRACT

In some embodiments, an apparatus includes an electronic device that has a ground to receive an electrostatic discharge. A radiation detector, mounted on the electronic device, generates a differential signal in response to the electrostatic discharge.

21 Claims, 8 Drawing Sheets

RADIATION DETECTOR FOR ELECTROSTATIC DISCHARGE

BACKGROUND OF THE INVENTION

1. Field of the Invention

The present invention relates to electronic devices, and in particular, to the testing of electronic devices.

2. Description of Related Art

Control of static charge in test and assembly of semiconductor components is an activity with increasing importance as the components become more sensitive to electrostatic discharge (ESD). Common in test and assembly is the practice of monitoring certain equipment that might produce damaging ESD events, such as socketing of a charged component. One known method for monitoring electrostatic discharge is to use a near-field ball antenna. The antenna is positioned approximately 15–30 cm from the equipment and components to be monitored. An oscilloscope is used to pick up electromagnetic interference (EMI) signal caused by an ESD event. Components tested under a charged device model (CDM) are typically subjected to simulated ESD pulses using an automated CDM testing process.

The EMI signals picked up by the prior art antenna have an oscillatory waveform. This is because the component under test is coupled to a metal ground. The electrostatic discharge from the ESD event is discharged into the metal ground and the oscillations generated occur in the metal ground. These oscillations occur despite the fact that the ESD event is a largely unipolar event (i.e., a brief current spike) from the point of view of the charged component generating the electrostatic discharge. This is because the component is a small electronic component relative to the much larger metal ground. The sudden injection of current into the large metal ground causes ringing in that metal ground, with the resulting radiation (EMI signals) being picked up by the near-field ball antenna. Having spread into the large expanse of the metal ground, the charge does not find its way back into the small component in a significant way, so the unipolar pulse at the component is consistent with continuing electrical oscillations in the metal ground as the energy dissipates.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 1:
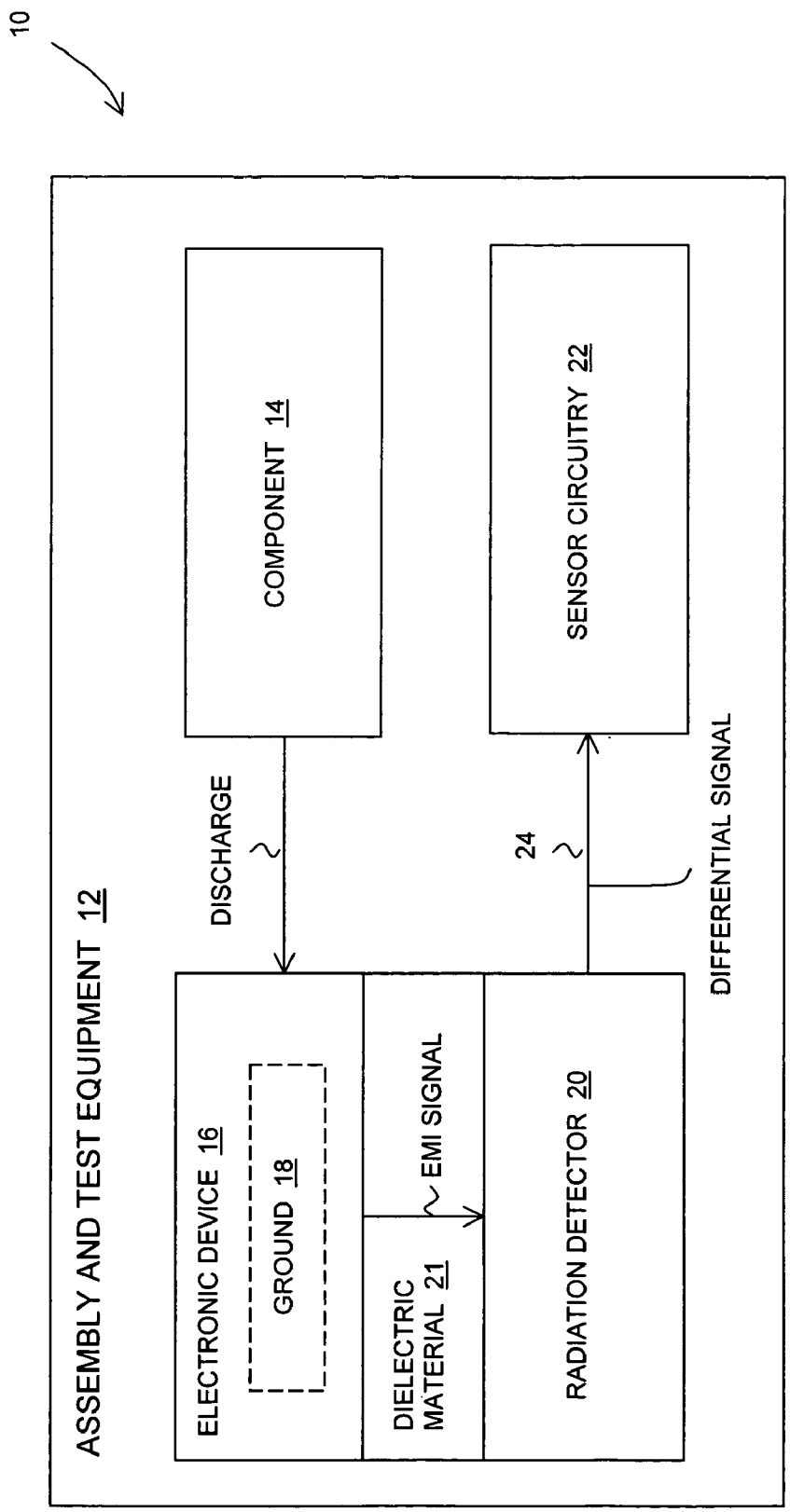
FIG. 1 is a block diagram of a system according to the various embodiment of the present invention.

Referring to FIG. 1, there is shown a system 10 according to various embodiments of the present invention. The system 10 may include assembly and test equipment 12 wherein one or more semiconductor components 14 may be socketed or plugged into an electronic device 16. The electronic device 16 may be temporarily mounted in the equipment 12 for testing and/or assembly. The electronic device 16 may include a ground 18 to which the component 14 is electrically coupled upon being plugged into the electronic device 16. The system 10 further includes a radiation detector 20 positioned near (i.e., in close proximity to) the ground 18. As will be described hereinafter, the various embodiments of the radiation detector 20 may be described as being disposed in an adjacent, spaced-apart relationship to the ground 18. The ground 18 and the radiation detector 20 are separated by a dielectric material 21, with the width of the dielectric material 21 between the ground 18 and the radiation detector 20 defining this adjacent, spaced apart relationship. The system further includes a sensing circuit 22 electrically coupled to the radiation detector 20 by way of a feed line 24. An electrostatic discharge (ESD) event in the equipment 12 may be caused, for example, by the socketing of the component 14 when it has a charge. With the discharge of this charge to the ground 18, a high frequency electromagnetic oscillation of the ground 18 is caused by a balancing charge being extracted from the ground 18. The oscillating ground 18 generates an electromagnetic interference (EMI) signal which radiates from the ground 18, passes through the dielectric material 21, and is picked up by the radiation detector 20. The radiation detector 20 (i.e., ESD event detector) generates a differential mode signal or differential signal in response to this EMI signal. The sensing circuit 22, in response to the differential signal, provides at least a notification signal indicating the occurrence of the ESD event. Due to the strength of the differential signal, quantifying the magnitude of the ESD event may also be possible.

In a first group of embodiments to be described hereinafter, the radiation detector 20 may be formed by placing one or more coaxial lines adjacent to the oscillating ground 18 of the electronic device 16. The coaxial lines each include a ring-like shield and a center conductor wire separated from the shield by a dielectric. The shield of the coaxial line is electrically coupled to the ground 18 of the electronic device 16 in a number of selected locations on the electronic device 16. The center conductor wire of the coaxial line is disposed in an adjacent, spaced-apart relationship to (i.e., in close proximity with) the coaxial shield, i.e. the extended ground. Since the coaxial shield is electrically coupled to the ground 18, the center conductor wire of the coaxial shield is disposed in the adjacent, spaced-apart relationship not only to the shield, but also to the ground 18. The dielectric material 21 comprises the annular insulating material of the coaxial cable which is interposed between the center conductor wire and the ground shield. Hence, the thickness of the insulating material between the center conductor wire and the shield defines the "adjacent, spaced-apart" relationship between the ground 18 and the radiation detector 20. In this manner, the coaxial shield becomes part of the ground 18 and the center conductor wire becomes part of the radiation detector 20.

In a second group of embodiments to be described hereinafter, the radiation detector 20 may include one or more metallic traces integrated into the electronic device 16 so as to be positioned adjacent to the oscillating ground 18. These traces may serve the same purpose as the center conductor wire of the first group of embodiments. Generally, for each embodiment of the first group of embodiments, there is a corresponding embodiment in the second group of embodiments. The first group of embodiments may be used where an already-built electronic device 16 is retrofitted with the radiation detector 20. The second group of embodiments may be used where the radiation detector 20 is incorporated into the electronic device 16 during fabrication. By incorporating the radiation detector 20 into the electronic device 16 during fabrication, the need to extend the ground 18 above the surface of the electronic device 16 via the shield of the coaxial line is no longer needed. As will be discussed hereinafter, the dielectric material 21 comprises a layer of a dielectric material interposed between the the ground 18 and the radiation detector 20. Hence, the thickness of the dielectric layer between the ground 18 and the radiation detector 20 defines the "adjacent, spaced-apart" relationship between the ground 18 and the radiation detector 20.

With respect to the first and second group of embodiments, relative to the use of the antenna in the prior art, the radiation detector 20 may provide a more direct way to detect the ESD event by placing coaxial lines or metallic traces near the oscillating ground 18 so as to cause a strong differential signal to be generated. This differential signal may be easily selected and isolated from the generating source, i.e., the electrical discharge from the component 14. More specifically, the use of the radiation detector 20 may produce a strong electrical signal when charged semiconductor components 14 touch metal with their pins or like contacts, and causes the discharge event. Extracting the strong differential signal is made possible because the ringing ground 18 oscillates in a relatively predictable way, thus allowing for the radiation detector 20 to be placed near, on or integrated into the electronic device 16 in order to pick up the differential signal.

Generalizing the various embodiments of the radiation detector 20 of the first and second group of embodiments as described below, the radiation detector 20 may include at least one signal pickup wire mounted on the electronic device 16 and placed near the ground 18 of the electronic device 16 so as to pick up a strong differential signal. The dielectric material 21 is interposed between the ground 18 and the radiation detector 20, so that the at least one signal pickup wire is disposed in an adjacent, spaced-apart relationship (i.e., in close proximity) with a surface of the ground 18. In one embodiment, a substantial differential mode signals may be obtained when the charged component 14 comes into contact with the electronic device 16 at a location (e.g., socket location, for example) positioned off-center on the electronic device 16 (e.g., printed circuit board). In other embodiments, a rearrangement of its geometry on the electronic device 16 or a topological distortion of the signal pickup wire may produce a substantial differential signal. Generally, a stronger EMI signal may be picked up when the signal pickup wire (or wires) of the radiation detector 20 is aligned with a dominant ESD current direction in the ground and a feed point to the feed line 24 is placed near the ESD source (i.e., place where the component 14 is socketed). In one embodiment, the signal pickup wire or wires may be located off-center relative to a center of the electronic device 16 in one or more peripheral regions of the electronic device 16 along substantially most of a width and/or length dimension of the electronic device 16. A "peripheral region" may be defined to be planar region of the electronic device 16 that is near to and extends along all or most of one of the width or length edges of the electronic device 16.

In various embodiments to be described hereinafter, the electronic device 16, for example, may be a printed circuit board (PCB). A ground plane, formed by one or more of the layers of the PCB, may comprise the ground 18. The component 14, for example, may be an integrated circuit (IC) package which is plugged or socketed into a socket mounted on the PCB. The sensing circuit 22 may include, for example, an oscilloscope in one embodiment or, due to the strong differential signal, inexpensive sensing electronics, such as a bridge diode, in another embodiment. Likewise, due to the strong differential signal, the differential signal may be filtered prior to being sent to the sensing circuit 22 in one embodiment.

In the previously-mentioned first group of embodiments, the radiation detector 20 may be implemented in an electronic device 16 comprising a pre-existing, already built PCB that may be retrofitted with the radiation detector 20. One way to create the radiation detector 20 for the already-built PCB may be to use a center conductor wire of a coaxial line or cable as the EMI signal pickup wire, so that the impedance environment may be uniform. The coaxial line shield then may be attached to the ground 18, i.e., the ground plane, at a number of points. Generally, the shield becomes an above surface extension of the embedded ground plane. Thus the signal pickup wire may be DC isolated from the ground 18. These embodiments include various arrangements of one or more coaxial lines in the vicinity of the ground, as will be described hereinafter. However, other arrangements providing a signal pickup wire may be implemented with already-built PCBs without the use of coaxial lines.

In the previously-mentioned second group of embodiments, the PCB may be fabricated to integrate the radiation detector 20 into the electronic device 16. In these embodiments, one or more impedance-controlled traces may be designed into the multi-layer PCB to form the radiation detector 20, as will be described hereinafter. As previously mentioned, for each embodiment in the first group for an already-built PCB having a retrofitted radiation detector 20, there is a corresponding embodiment in the second group for a modified PCB having an integrated radiation detector 20 built into the layers of the PCB. In general, the center conductor wires of the coaxial lines of the first group of embodiments become metallic conductor traces in the second group of embodiments.

With respect to both the first and second group of embodiments, the thickness of the interposed dielectric material 21 defines the "adjacent, spaced-apart relationship" between the ground 18 and the detection 20, as previously discussed. In the first group of embodiments, the thickness of that dielectric material 21 may be less than 2 mm for the coaxial cable (the annular thickness of the insulator material between wire center conductor and outer shield). In the second group of embodiments, the thickness of that dielectric material 21 may be less than 1 mm for the dielectric board layer. In general, with respect to all embodiments, the distance between the ground 18 and the radiation detector 20 may be less than 5 mm.

With respect to both the first and second group of embodiments, the solid dielectric material 21 is interposed between the radiation detector 20 and the ground 18, as previously discussed. Consequently, not only does the system 10 have a radiation detector 20 which is in close proximity to the ground 18 in comparison to the prior art, but unlike the prior art, the ground 18 and the radiation detector 20 are separated by a solid dielectric material 21. The dielectric material 21 may strengthen the coupling between the ground 18 and the radiation detector 20, as compared with air, due to the higher dielectric constant of the dielectric material 21. For example, in the case of the first group of embodiments, the dielectric material 21 of the coaxial cable may be polyethylene. Polyethylene has a dielectric constant of 2.25, although some coaxial insulators have a dielectric constant less than 2. As another example, in the case of the second group of embodiments, the dielectric material 21 may be an epoxy glass board insulator, such as FR-4. The dielectric constant for the board insulator FR4 is greater than 4. In general, with respect to all the embodiments, the solid dielectric material 21 may have a dielectric constant greater than 1.5, which is substantially higher than that of air (a dielectric constant slightly greater than 1.0).

With respect to both the first and second group of embodiments, it may be desirable to select a good differential signal to obtain a better measurement of the EMI signal. To select a good differential signal, it may be desirable to suppress any common mode signals that might reflect and convert to an uncontrolled differential signal. The suppression of common mode signals may provide better reproducibility. Hence, common mode suppression may be desirable even though it may reduce the overall signal level. In the various embodiments below, the radiation detector 20 may further include a ferrite and/or a transformer, as will be described hereinafter, to select the differential signal. As also will be described, direct current (DC) isolation of the radiation detector 20 from the ground 18 may be part of this selection process for the differential signal. More specifically, in some embodiments, a miniature DC-isolated transformer interposed between the radiation detector 20 and the feed line 24 may assist in selecting the differential signal. But even if the feed line 24 is impedance-matched appropriately on both sides, the transformer might produce a noticeable reflection from the feed line. Hence, in some embodiments, it may be desirable to select the differential signal without a transformer, i.e., with only a ferrite on the feed line 24. In other embodiments, both the transformer and the ferrite may be used.

With respect to both the first and second group of embodiments, it may be desirable to have the resulting waveform displayed on the oscilloscope or received by other signal detection instruments of the sensing circuit 22 to depend on the differential signal received by the radiation detector 20 and not on the length or position in space of the feed line 24 of the sensing circuit 22. In this way, the resulting waveform may be more meaningful. For example, the resulting waveform may be related back to the ESD event to establish how strong the discharge was from the component 14. Hence, impedance matching may be incorporated into the various embodiments. Depending upon the embodiment, the radiation detector 20 and sensing circuit 22 may be impedance-matched in one direction looking toward the sensing circuit 22 or may be impedance-matched in both directions, if desired, so that a high degree of lock-out from extraneous noise may be achieved. In the case of matching impedance in both directions, a backward impedance match for signals going back into the radiation detector 20 may be desirable in some applications and may terminate any reflections or pickup-going the other direction on the feed cable 24. Consequently, in addition to classifying the various embodiments of the present invention as to whether the radiation detector 20 is retrofitted or built in, the various embodiments also may be classified as to whether there is impedance matching in one direction or two directions. In other words, the various embodiments may be classified as to whether the radiation detector 20 is or is not impedance matched when looking into the radiation detector 20 from the sensing circuit 22. When looking into the sensing circuit 22 from the radiation detector 20, impedance matching may be included in all of the various embodiments. In the various embodiments described hereinafter, the input impedance to the sensing circuit 22 may match the impedance of the feed line 24. For example, the input impedances of the sensing circuit 22 and the feed line 24 may both be 50 ohms.

Figure 2:
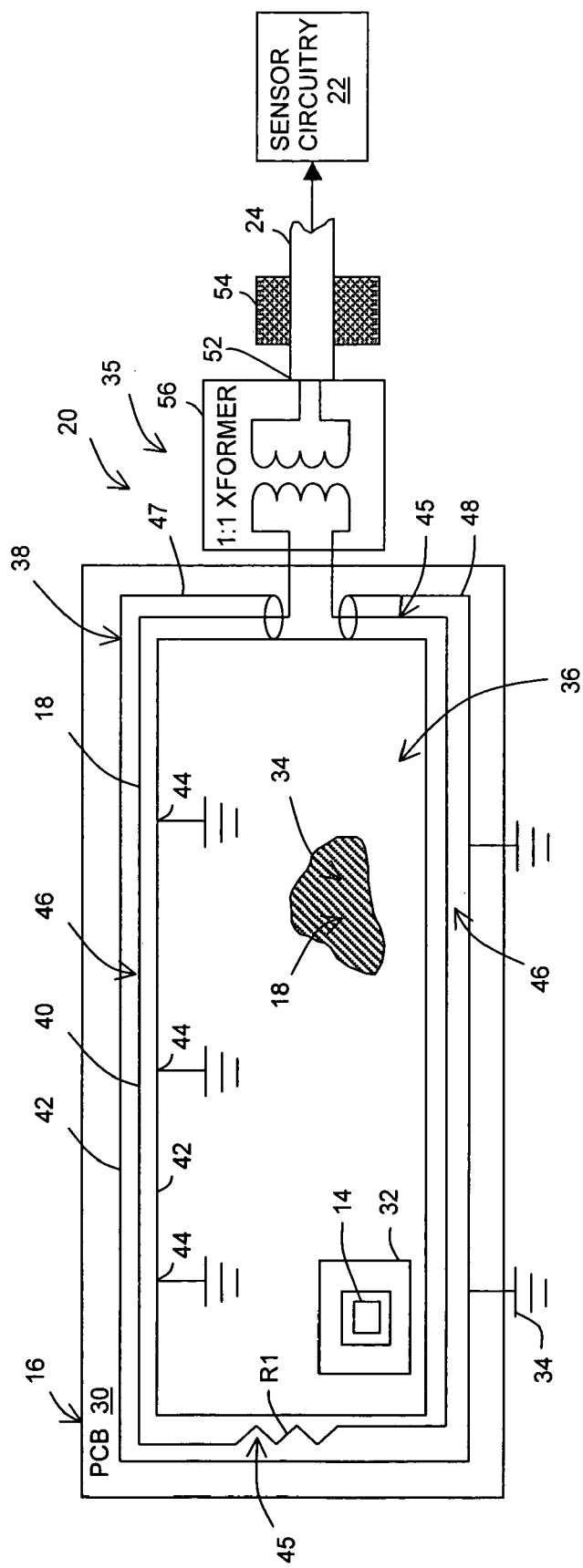
FIG. 2 is a schematic block diagram of a radiation detector according to one embodiment of the present invention.
Figure 3:
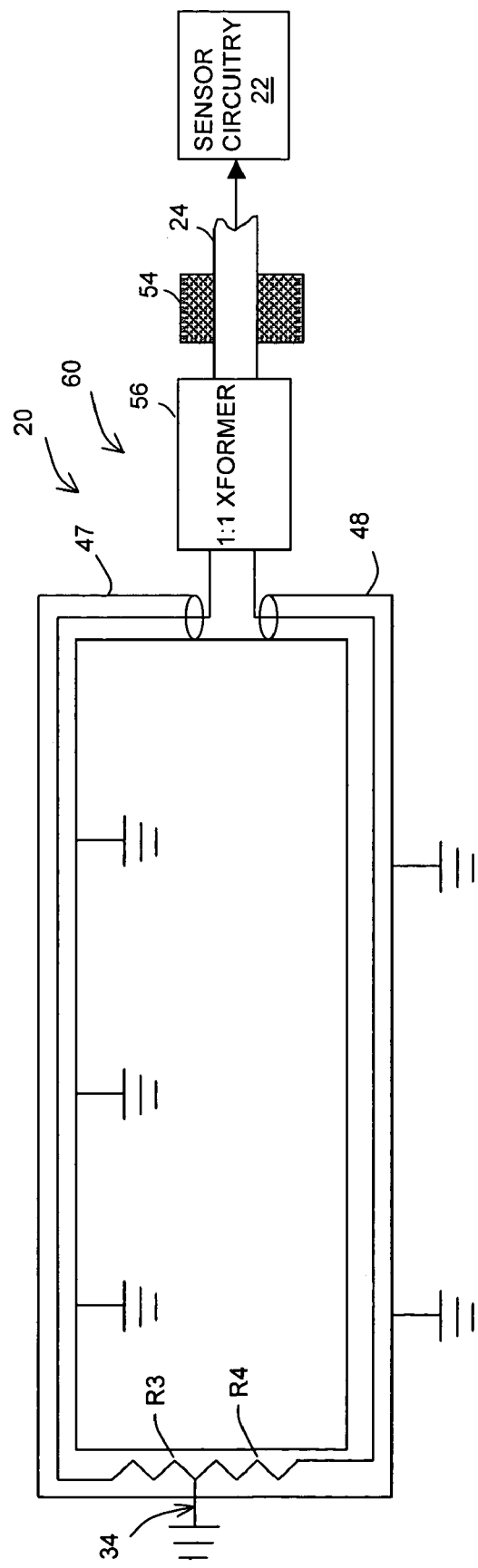
FIG. 3 is a schematic block diagram of the radiation detector according to another embodiment of the present invention.
Figure 4:
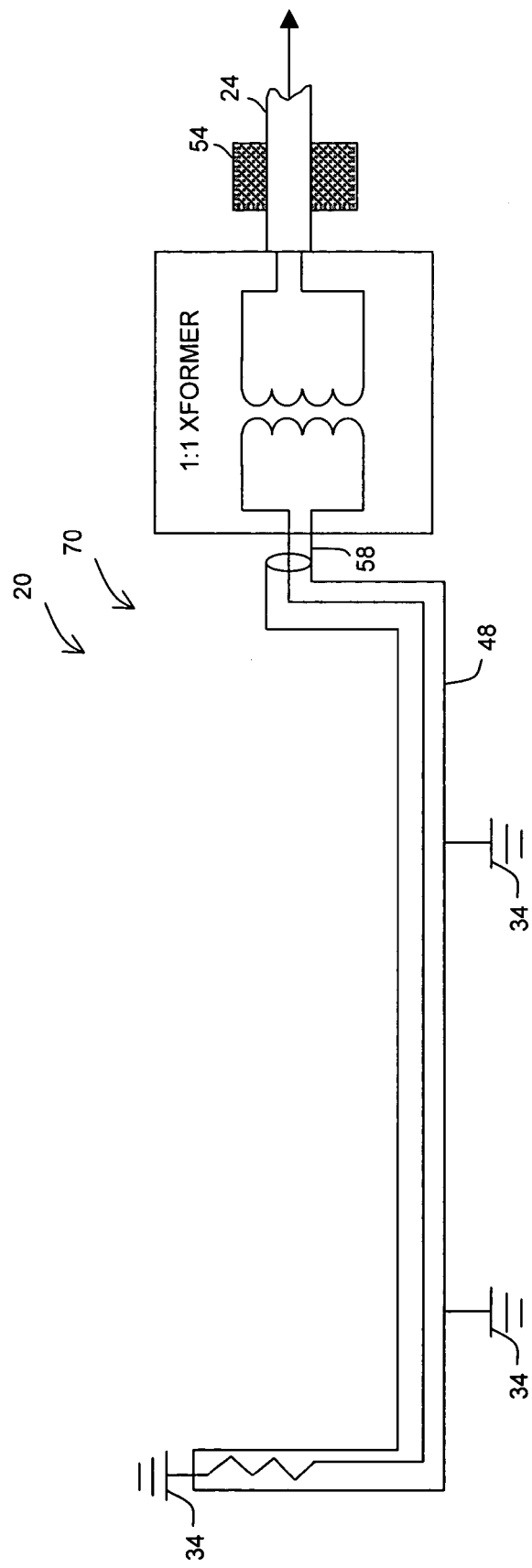
FIG. 4 is a schematic block diagram of the radiation detector according to another embodiment of the present invention.

Referring to FIGS. 2–4, a few illustrative embodiments of the previously-mentioned first group of embodiments of the radiation detector 20 are shown. As shown in FIG. 2, in each of these embodiments the electronic device 16 comprises an already-built PCB 30. Moreover, each of these embodiments of FIGS. 2–4 illustrates impedance matching in both directions. FIGS. 3 and 4 show alternative embodiments of the radiation detector 20 for the PCB 30; however, the already-built PCB 30 is not shown in FIGS. 3 and 4 since it remains unchanged for the alternative embodiments. As will be described in detail hereinafter, the embodiment of the radiation detector 20 in FIG. 2 illustrates series impedance matching of the coaxial line; the embodiment of the radiation detector 20 in FIG. 3 illustrates shunt impedance matching of a double ended coaxial line; and the embodiment of the radiation detector 20 in FIG. 4 illustrates shunt impedance matching of a single ended coaxial line. Generally, it has been found that the series impedance matching of the embodiment of FIG. 2 may provide a stronger differential signal than the two shunt matching embodiments of FIGS. 3 and 4.

Referring to FIG. 2, one or more semiconductor components 14 may be socketed into one or more sockets 32 of the PCB 30 (only one socket and component are shown) during assembly and test, with the oscillating ground 18 including a ground plane 34 of the PCB 30. Hence, the socket 32 is electrically coupled to the ground plane 34 by one or more conductors (not shown) extending from the socket 32 to the ground plane 34 by way of one or more vias (not shown). This ground plane 34 basically may be a planar, rectangular or circular metallic slab comprising one or more of the internal layers of the PCB 30, with the ground plane 34 being shown in FIG. 2 by cutting away one or more upper surfaces 36 of the PCB 30. In one embodiment, the socket 32 may be positioned off-center with respect to the center of the PCB 30, as illustrated in FIG. 2. In one embodiment, the PCB 30 may be a motherboard and the component 14 may be an IC package containing a processor chip.

Referring specifically to FIG. 2, one of the embodiments of the radiation detector 20 from the first group is shown, which has the retrofitted PCB 30. More specifically, the radiation detector 20 may comprise a series matched radiation detector 35. In this embodiment, the radiation detector 35 may be made with a coaxial cable or line 38 formed in a loop. The coaxial line 38 may have a center conductor wire 40 and ring-like shield 42. The shield 42 may be attached to the ground plane 34 in a plurality of locations 44 on the PCB 30; hence, the shield 42 becomes part of the ground 18. The loop of the coaxial line 38 may be tied down on the periphery of the PCB 30. More specifically, it may be tied down along its two width peripheral regions 45 of the PCB 30 adjacent to its two width edges and along its two length peripheral regions 46 along its two length edges.

The coaxial line 38 may include two 25-ohm lines 47 and 48 (each of which may be two 50-ohm lines in parallel) that are equal in length and end in a series connection with a 50 ohm resistor R1, which completes the loop. Since the two 25-ohm lines are in series, the resultant impedance of the two lines is 50 ohms. The 50 ohms of the series resistor R1 provides a 25-ohm termination to a virtual ground for each of the coaxial lines 47 and 48, while retaining the DC isolation from the ground plane 34. Hence, the coaxial lines 47 and 48, when combined with the resistor R1, provide impedance matching. The feed line 24 to the sensing circuit 22 and the input to the sensing circuit 22 also may be 50 ohms. The beginning of the feed line 24 for the sensing circuit 22 is defined to be the feed point 52. At the feed point 52, the impedance is balanced or matched by having 25 ohm coaxial lines 47 and 48 (including the resistor R1) on one side and 50 ohm feed line 24 on the other side. In another embodiment, if 50-ohm coaxial lines are used for the lines 47 and 48, then the resistor R1 may be 100 ohms and a 2:1 impedance transformer may then be used, or else the feed line 24 may have 100 ohms impedance.

As shown in FIG. 2, the radiation detector 35 may further include a ferrite 54 positioned around the feed line 24 to suppress the common mode signals. This arrangement of the radiation detector 35 may select the differential signal and send it to the sensing circuit 22. In the embodiment of FIG. 2, the ferrite 54 may be sufficient by itself. Optionally, a 1:1 transformer 56 may be located at the feed point 52 and coupled on one side to the ends of coaxial lines 47 and 48 and coupled on the other side to the feed line 24 for the sensing circuit 22 to supplement the suppression of the common mode signals by the ferrite 54. Because the loop of coaxial line 38 is DC isolated from the PCB 30, either the transformer 56 or the ferrite 54 may be sufficient to suppress the common mode signals while maintaining the impedance match. In the embodiments where the ferrite 54 by itself is sufficient, a better impedance match in the direction looking into the radiation detector 35 may be achievable because the miniature transformers 56 used (Mini-Circuits T1-1, for example) may have some reflection coefficient over frequency even if impedance matched on the other side.

Referring to FIG. 3, another embodiment according to the present invention of the radiation detector 20 may comprise a shunt matched, double ended radiation detector 60. The radiation detector 60 may be construed much in the same way as the embodiment of FIG. 2 (reference number of the same parts stay the same). The radiation detector 60 again may include the coaxial lines 47 and 48. Likewise, the radiation detector 60 may include the transformer 56 and the ferrite 54. However, the transformer 56 may now be required, because the termination goes explicitly to ground plane 34 and thus there is no DC isolation without the transformer 56. More specifically, the radiation detector 60 may become a double-ended shunt match with two 25 ohm terminations to ground at its far end replacing the series match of FIG. 2. The two 25 ohm terminations may be formed by a pair of 25 ohm resistors R3 and R4 coupled between the ground plane 34 and the ends of 25-ohm coaxial lines 47 and 48, respectively. In another embodiment, if lines 47 and 48 are 50-ohm lines, then R3 and R4 each may be 50 ohms and a 2:1 impedance transformer may be used, or else the feed line 24 may have 100 ohms impedance.

Referring to FIG. 4, another embodiment according to the present invention of the radiation detector 20 may comprise a shunt matched, single ended radiation detector 70. The radiation detector 70 may comprise essentially half of the radiation detector 60 shown in FIG. 3. This single-ended shunt match may lead to a simpler design in that the single 50 ohm line 48 may be terminated by 50 ohm resistor R4 at its far end, with the resistor R4 being coupled to the ground plane 34. Generally, the transformer 56 may be required for this embodiment. One side of the transformer 56 may be grounded as shown by line 58.

Figure 5:
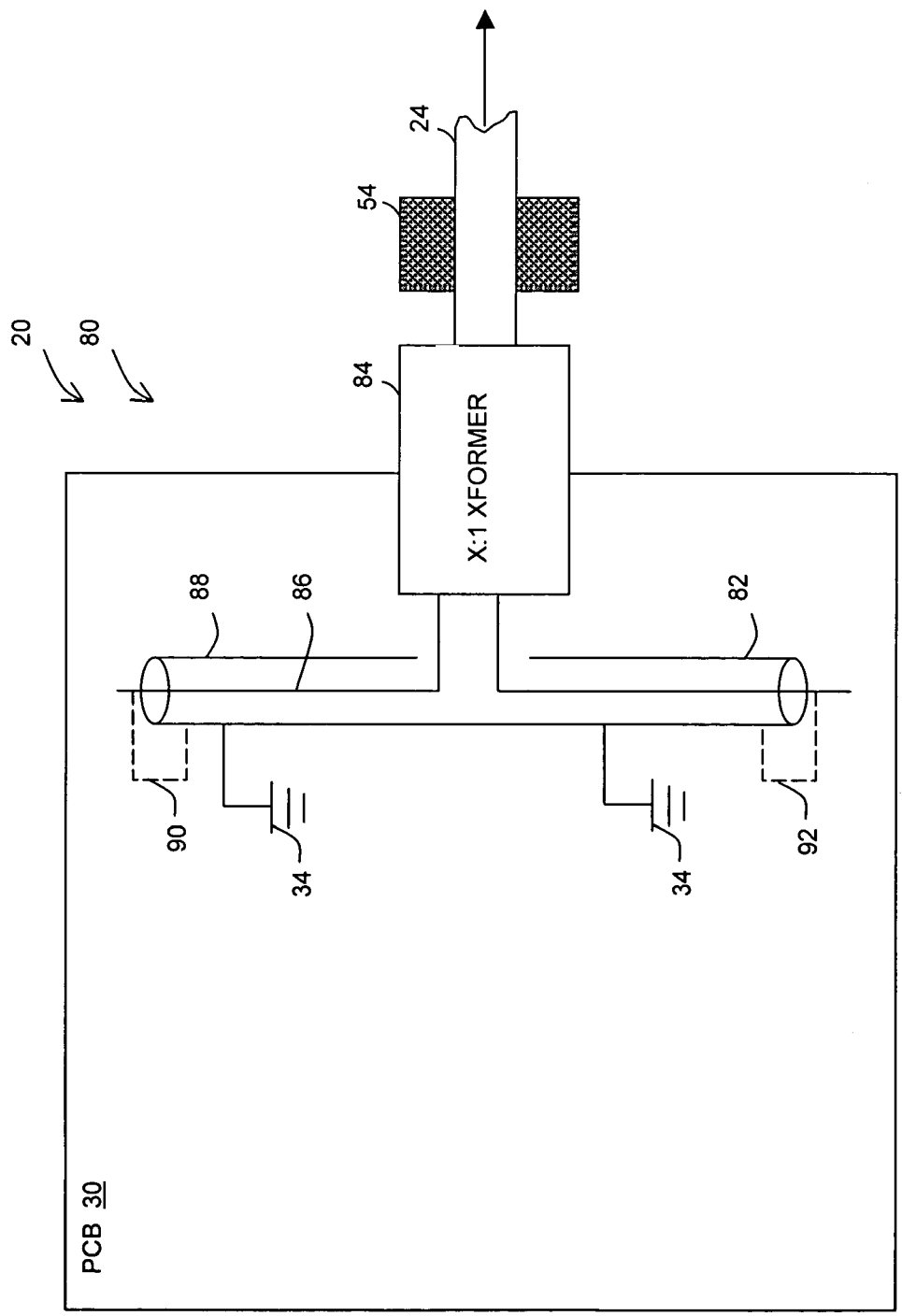
FIG. 5 is a schematic block diagram of the radiation detector according to another embodiment of the present invention.
Figure 6:
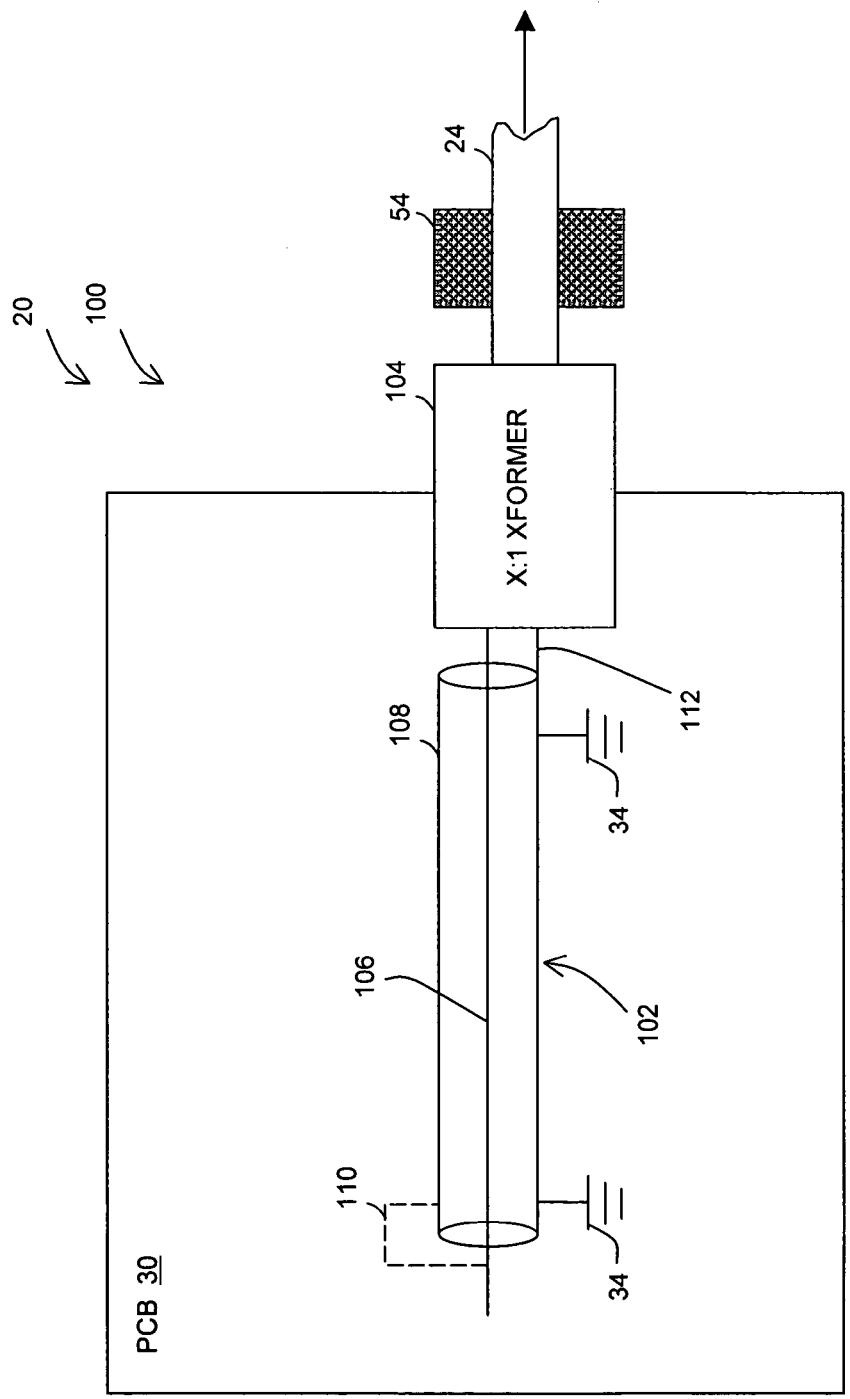
FIG. 6 is a schematic block diagram of the radiation detector according to another embodiment of the present invention.
Figure 7:
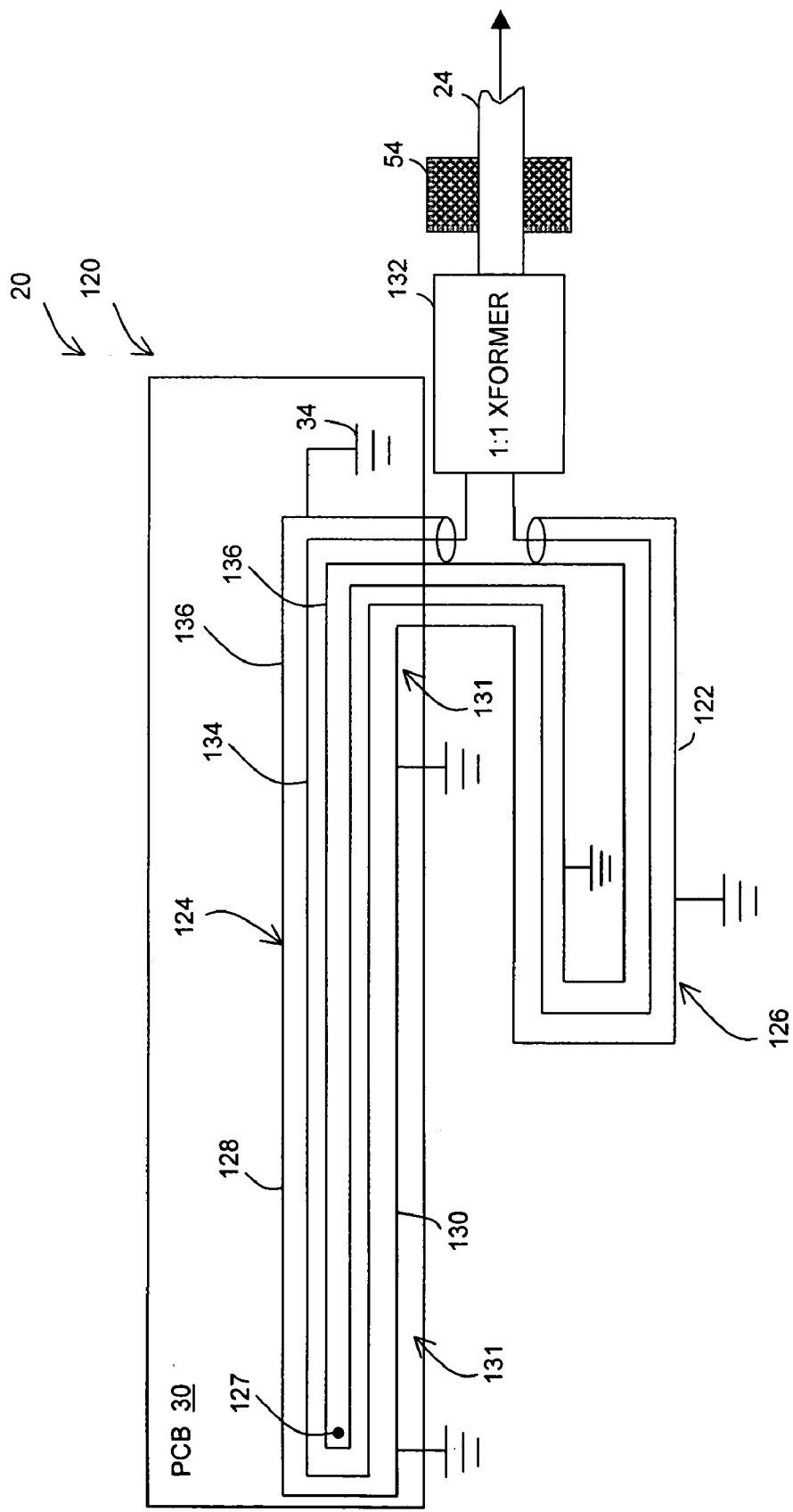
FIG. 7 is a schematic block diagram of the radiation detector according to another embodiment of the present invention.

Referring to FIGS. 5–7, the embodiments of the radiation detector 20 illustrated in these FIGURES also may be for the already-built PCB 30 (see FIG. 2), but in these embodiments there is impedance matching only in one direction, i.e., looking into the sensing circuit 22. If no impedance match is required as one looks back into the radiation detector 20, several additional options may be available, as illustrated by these embodiments. However, as with the embodiments of FIGS. 2 through 4, the already-built PCB 30 must be retrofitted with the radiation detector 20. Although the embodiments of the radiation detector 20 differ, the description of the already-built PCB 30 is also applicable to these embodiments. Again, for each of these retrofitted embodiments, there is a corresponding embodiment in the second group where the radiation detector 20 is integrated into the layers of the PCB.

Referring to FIG. 5, another embodiment according to the present invention of the radiation detector 20 may comprise a double-ended or dipole radiation detector 80, which is illustrated in two forms: one being an open dipole and the other being a shorted dipole. The radiation detector 80 may include a coaxial line 82 coupled at its center to a transformer 84. The coaxial line 82 has a center conductor wire 86 and a ring-like shield 88. The shield 88 may be electrically coupled to the ground plane 34 of the PCB 30. In the open dipole embodiment, the center conductor wire 86 is not electrically coupled to the shield 88. In the shorted dipole embodiment, the center conductor wire 86 and the shield 88 are electrically coupled or shorted together at its ends by a pair of connectors 90 and 92, as shown by the dashed lines in FIG. 5. With shorts in place in the shorted dipole embodiment, the transformer 84 may be required for DC isolation, but now the transformer ratio may need to differ from the previously used 1:1 ratio in order to achieve a desired signal level. In one embodiment, the shorted dipole embodiment may have a 300 ohm input impedance at half-wave resonance and a 6:1 transformer ratio may match to 50 ohms in that frequency band. The ferrite 54 and feed line 24 to the sensing circuit (not shown) remains the same as in the earlier described embodiments.

Referring to FIG. 6, another embodiment according to the present invention of the radiation detector 20 may comprise a single-ended or single pole radiation detector 100, which is illustrated in two forms: one being an open single pole and the other being a shorted single pole. The radiation detector 100 may include a coaxial line 102 coupled at its center to a transformer 104. The coaxial line 102 may have a center conductor wire 106 and a ring-like shield 108. The shield 108 may be electrically coupled to ground plane 34 of the PCB 30. In the open single pole embodiment, the center conductor wire 106 is not electrically coupled to the shield 108. In the shorted single pole embodiment, the center conductor wire 106 and the shield 108 may be electrically coupled or shorted together at its end by a connector 110, as shown by the dashed line in FIG. 6. With short in place in the shorted dipole embodiment, the transformer 104 may be required for DC isolation. The transformer ratio may have a 1:1 ratio. The transformer 104 may be grounded on one side as shown by a conductor 112. The ferrite 54 and the feed line 24 to the sensing circuit (not shown) remains the same as in the earlier described embodiments.

Referring to FIG. 7, another embodiment according to the present invention of the radiation detector 20 may comprise a folded loop radiation detector 120. The radiation detector 120 may include a loop of coaxial line 122 having a folded wire portion 124 and a slack or phase shifting wire portion 126. The folded wire portion 124 may be folded tightly around an off-center point, such as the illustrative point 127 on the PCB 30, so that the folding wire portion 124 may include two wire segments 128 and 130 of the coaxial line 122. These two wire segments 128 and 130 may be disposed adjacent to each other. The two wire segments 128 and 130 may be aligned along a peripheral region 131 of the PCB 30, which extends along all or most of one of the edges of the PCB 30. One end of the phase shifting wire portion 126 of the coaxial line 122 may be electrically coupled on one side of a transformer 132 and the other end may be coupled to the wire segment 130. The phase shifting wire portion 126 may be a loop alongside of, but not on, the PCB 30 (as shown in FIG. 7) or it may be a loop included on the PCB 30. The coaxial line 122 may have a center conductor wire 134 and a ring-like shield 136. The shield 136 may be tied down to the surface of the PCB 30 and may be electrically coupled to ground plane 34 of the PCB 30. In the corresponding embodiment of the second group, the signal pickup wire of the phase shifting loop would be integrated into the PCB.

In comparison to the other embodiments, the radiation detector 120 may give a substantial amount of differential signal. Similar or substantially identical current signals may be induced in each of two wire segments 128 and 130 stretched over the PCB 30. This may not produce a differential signal by itself, but then one of the wire portions, the wire segment 130, connects to an additional delay loop of the phase shifting wire portion 126, which in turn may cause a phase shift for most high frequencies. Hence, a phase shift may result from the extra line length at bottom, causing a differential signal. As noted earlier, the strongest differential signal may result when the radiation detector 120 (i.e., wire segments 128 and 130) are aligned with the ESD current and the ESD current spreads out beginning at the front end of the radiation detector 120. The series impedance matched coaxial line in the embodiment of FIG. 4 may also be rearranged in this same way, but resulting signal levels may tend to be lower than that of the embodiment of FIG. 7.

As one example of a typical waveform (and its FFT spectrum) resulting from a CDM event picked up by the radiation detector 120, a differential signal with over a 2V peak-to-peak signal may be generated by the radiation detector 120 with a charge on the component (not shown) of 2 nanocoulombs, or 200V on a component with approximately 10 pf capacitance with respect to the PCB 30 (200V is a "factory limit" on ESD control, above which events are believed to be very scarce). The spectrum of the differential signal may go through a series of peaks and valleys (over 20 db separating them), due to the length of the phase shifting wire portion 126.

Figure 8:
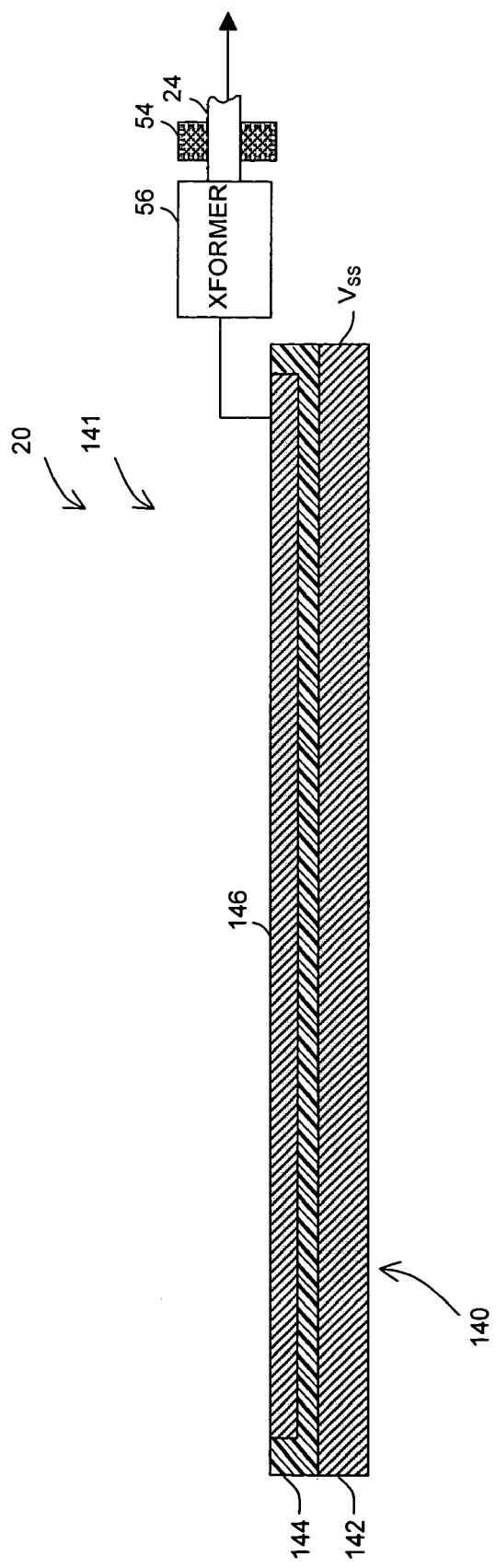
FIG. 8 is a cross-sectional view of a printed circuit board incorporating the radiation detector according to another embodiment of the present invention.

Referring to FIG. 8, an embodiment according to the present invention is shown which generically represents the second group of embodiments of the radiation detector 20. As previously described, each of the embodiments of the first group has its counterpart in the second ground of embodiments where the radiation detector 20 is integrated into a PCB 140. In FIG. 8, the radiation detector 20 comprises an integrated radiation detector 141 for use with the PCB 140. Two illustrative layers of the multilayer PCB 140 are illustrated in FIG. 8, but the PCB 140 may include other layers. The PCB 140 includes a metal ground plane 142 (i.e., the grounded oscillating Vss plane) and a dielectric detection plane 144 with at least one conductive metallic trace 146 (i.e., microstrip line) being deposited in its side opposite to the ground plane 142 so that the traces 146 may be disposed in an adjacent, spaced-apart relationship to the ground plane 142. Alternatively, an entire layer may be interposed between the layer containing the traces 146 and the ground plane 142. Generally, the layouts of the traces 146 in the dielectric detection plane 144 may that many configurations, such as those patterns of the center conductor wires shown in the various embodiments of FIGS. 2–7. The radiation detector 141 may include the previously described components of the ferrite 54 and/or the transformer 56, along with the feed line 24 going the sensing circuit (not shown) as exists in the various embodiments of FIGS. 2–7. Each of traces 146 (or trace 146) may be a controlled impedance line, with its dimensions giving a desired impedance for impedance matching purposes.

Referring to FIGURES, generally it may be desirable to unobtrusively locate the radiation detector 20 on the plane of the PCB 30 (see FIGS. 1–7) with a low profile. Integrating the radiation detector 20 into the PCB 140 of FIG. 8 may achieve the same purpose. Undertaking such integration presupposes control over the manufacturing of the board design so as to avoid the need to retrofit the PCB.

Referring back to FIG. 1, there are many systems 10 in which the radiation detector according to the present invention may be used. One example of such a system is Intel's Pentium Platform Validation (PPV) system. An ESD event in the PPV system is mostly likely to occur when a processor is being loaded into the system by vacuum wand for subsequent testing. The building of the radiation detector 20 into the PPV equipment may allow for instant observation and data collection when an ESD event happens (as during operator loading of a PPV platform). By incorporation of the radiation detector 20, a stronger differential signal may be fed to sensing circuit 22 which is part of the PPV system, but is isolated from the oscillating ground 18. In one embodiment, the sensing circuit 22 may be included in a plug-in card. The sensing circuit 22 may use any of a number of standard detection methods. The radiation detector 20 may comprise any of the radiation detectors disclosed herein, such as the controlled impedance line detector of FIG. 8. In this case, traces may be made on the same multilayer PCB used as the PPV platform, with those traces being above the oscillating Vss planes and picking up signal just as the coaxial lines do. The output may go to the sensing circuit 22, with transformer isolation and common mode choke ferrites as needed. In the PPV system, there are many ways for replacing the expensive oscilloscope as the sensing circuit 22, but the number of ways is multiplied when there is a strong differential signal available for sensing, as provided by the various embodiments of the radiation detector 20. For example, the sensing circuit 22 may include a high pass or band pass filter to filter the differential signal so that only a characteristic frequency range (e.g., 200–400 MHz) is read out. This filtered signal still may be stronger than any other signal in the environment. This filtering may be followed by sensing with a diode bridge. This sensing circuit 22 may lock out machine noise and the ordinary operation of circuitry on the PCB and allow easy sensing of real ESD events happening to the system.

Referring to FIG. 1, in one embodiment of the system 10 the equipment 12 may implement an automated charged device model (CDM) testing process wherein the component 14 may be tested by being subjected to simulated ESD pulses.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An apparatus, comprising:
   an electronic device including a ground to receive a electrostatic discharge;
   a radiation detector including at least one signal pickup wire, with the at least one signal pickup wire being disposed in an adjacent, spaced-apart relationship to the ground to generate a differential signal in response to the electrostatic discharge;
   a dielectric material interposed between the at least one signal pickup wire and the ground;
   a sensing circuit coupled to the at least one signal pickup wire and responsive to the differential signal to produce at least a signal indicating an occurrence of the electrostatic discharge; and
   wherein the electronic device is a printed circuit board; and the ground includes at least a ground plane formed in the printed circuit board.

2. The apparatus according to claim 1, wherein the at least one signal pickup wire is disposed off-center relative to a center of the printed circuit board and extends along a planar portion of the printed circuit board.

3. The apparatus according to claim 2, wherein the planar portion includes at least a peripheral region adjacent to one edge of the printed circuit board.

4. The apparatus according to claim 1, wherein the electronic device includes a component socket that is disposed off-center relative to a center of the printed circuit board.

5. The apparatus according to claim 1, wherein the printed circuit board includes a detection layer disposed adjacent to the ground plane; the at least one signal pickup wire comprises at least one conductive trace formed in the detection layer; and the at least one conductive trace is disposed in the adjacent, spaced apart relationship to the ground plane.

6. The apparatus according to claim 1, wherein the radiation detector includes at least one coaxial line having a center conductor wire and a shield; the at least one signal pickup wire comprises the center conductor wire; and the ground further includes the shield with the shield being electrically coupled to the ground plane in a plurality of locations.

7. The apparatus according to claim 6, wherein the plurality of locations are each positioned off-center relative to a center of the printed circuit board.

8. The apparatus according to claim 1, wherein the at least one signal pickup wire includes a wire loop having a first pair of ends coupled to the sensing circuit.

9. The apparatus according to claim 8, wherein the wire loop includes a pair of impedance-matched wire portions defining a second pair of ends and an impedance-matching resistor electrically coupled between the second pair of ends.

10. The apparatus according to claim 8, wherein the wire loop includes a folded loop wire portion coupled at one end to the sensing circuit and a phase-shift wire portion coupled at one end to the sensing circuit; the folded wire portion being wrapped around an off-center location on the printed circuit board so as to define a first wire segment to generate a first current in response to the electrostatic charge and a second wire segment to generate a second current in response to the electrostatic charge; the first and second wire segments having substantially the same length; the phase shift wire portion being coupled at its other end to the second wire segment to introduce a phase shift to the second current.

11. The apparatus according to claim 1, wherein the at least one signal pickup wire includes a pair of signal pickup wires, with the pair of signal pickup wires having the same impedance and being coupled at one of their ends to the sensing circuit.

12. The apparatus according to claim 11, wherein the pair of signal pickup wires have their other ends coupled to the ground through a pair of impedance matching resistors.

13. The apparatus according to claim 1, wherein the at least one signal pickup wire includes a single pickup wire coupled at one end to the sensing circuit and at the other end to the ground plane through an impedance matching resistor.

14. The apparatus according to claim 1, wherein the sensing circuit includes a feed line electrically coupled to the at least one signal pickup wire and the apparatus further comprises a ferrite disposed on the feed line to suppress a common mode signal component of an electromagnetic interference signal radiated from the ground and picked up by the at least one signal pickup wire.

15. The apparatus according to claim 1, wherein the at least one signal pickup wire is coupled at one end to the ground plane through an impedance matching resistor; the sensing circuit includes a feed line and the apparatus further comprises a transformer to suppress a common mode signal component of an electromagnetic interference signal radiated from the ground and picked up by the at least one signal pickup wire and to direct current isolate the sensing circuit, with the transformer being coupled on one side to the feed line and on the other side to the at least one signal pickup wire.

16. The apparatus according to claim 1, wherein sensing circuit includes a feed line and sensing equipment coupled to one end to the feed line; the feed line is electrically coupled at its other end to the at least one signal pickup wire; and the impedance at the input of the sensing equipment is substantially equal to the impedance of the feed line.

17. The apparatus according to claim 1, wherein the electronic device has a socket and a component plugged into the socket to generate the electrostatic discharge; the sensing circuit includes a feed line electrically coupled at one end to the at least one signal pickup wire; the at least one signal pickup wire is approximately aligned with a dominate direction of a current in the ground which is generated by the electrostatic discharge; and the end of the feed line is located adjacent to the socket.

18. The apparatus according to claim 1, wherein the dielectric material has a thickness of less than 5 mm.

19. The apparatus according to claim 1, wherein the printed circuit board includes a socket which generates the electrostatic discharge when a component is plugged therein.

20. A system, comprising:

an electronic device including a socket to receive a charged electronic componet and a ground electrically coupled to the socket;

a test equipment, having the electronic device mounted therein, operable to test the electronic device;

a radiation detector including at least one signal pickup wire, with the at least one signal pickup wire being disposed in an adjacent, spaced-apart relationship to the ground to generate a differential signal in response to an electrostatic discharge from the charged electronic component into the ground;

a dielectric material interposed between the at least one signal pickup wire and the ground;

a sensing circuit coupled to the at least one signal pickup wire and responsive to the differential signal to produce at least a signal indicating an occurrence of the electrostatic discharge; and wherein the electronic device is a printed circuit board; and the ground includes at least a around plane formed in the printed circuit board.

21. The system according to claim 20, wherein test equipment is operable to charge the electronic component.

* * * * *

UNITED STATES PATENT AND TRADEMARK OFFICE
CERTIFICATE OF CORRECTION

PATENT NO. : 7,126,356 B2 Page 1 of 1
APPLICATION NO. : 10/836458
DATED : October 24, 2006
INVENTOR(S) : Timothy J. Maloney It is certified that error appears in the above-identified patent and that said Letters Patent is hereby corrected as shown below:

Column 6
Line 7 "...feed cable 24..." should read -- ...feed line 24...--.

Column 13
Line 3, "...componet..." should read --...component...--.

Column 14
Line 8, "...a around plane..." should read --...a ground plane...--.

Signed and Sealed this

Tenth Day of June, 2008

JON W. DUDAS
*Director of the United States Patent and Trademark Office*